(12) United States Patent
Togawa

(10) Patent No.: US 11,101,779 B2
(45) Date of Patent: Aug. 24, 2021

(54) AMPLIFYING DEVICE

(71) Applicant: Yamaha Corporation, Hamamatsu (JP)

(72) Inventor: Takeshi Togawa, Anjo (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 16/720,397

(22) Filed: Dec. 19, 2019

(65) Prior Publication Data

US 2020/0127621 A1 Apr. 23, 2020

Related U.S. Application Data

(63) Continuation of application No. PCT/JP2017/024342, filed on Jul. 3, 2017.

(51) Int. Cl.
   *H03F 3/21*   (2006.01)
   *H04R 3/04*   (2006.01)
   *H03F 3/217*  (2006.01)

(52) U.S. Cl.
   CPC .......... *H03F 3/2175* (2013.01); *H04R 3/04* (2013.01); *H03F 2200/03* (2013.01); *H03F 2200/171* (2013.01)

(58) Field of Classification Search
   CPC .................. H03F 3/2175; H04R 3/04
   See application file for complete search history.

(56) References Cited

U.S. PATENT DOCUMENTS

| | | | |
|---|---|---|---|
| 9,287,826 B2* | 3/2016 | Wehmeier | H03F 3/217 |
| 9,713,922 B2* | 7/2017 | Sano | B41J 2/04541 |
| 10,511,296 B2* | 12/2019 | Lindemann | H04B 1/16 |
| 2005/0088336 A1* | 4/2005 | Sakamoto | G01S 7/038 |
| | | | 342/175 |
| 2008/0042743 A1* | 2/2008 | Wong | H03F 3/217 |
| | | | 330/10 |
| 2008/0260179 A1* | 10/2008 | Kurrat | H03F 3/2173 |
| | | | 381/103 |

(Continued)

FOREIGN PATENT DOCUMENTS

| | | |
|---|---|---|
| JP | 2005-181283 A | 7/2005 |
| JP | 2005-269580 A | 9/2005 |

(Continued)

OTHER PUBLICATIONS

International Search Report (PCT/ISA/210) issued in PCT Application No. PCT/JP2017/024342 dated Sep. 19, 2017 with English translation (two (2) pages).

(Continued)

*Primary Examiner* — Patricia T Nguyen
(74) *Attorney, Agent, or Firm* — Crowell & Moring LLP

(57) ABSTRACT

An amplifying device includes a self-excited class D amplifier circuit and a band elimination filter. The self-excited class D amplifier circuit includes a modulation circuit that is configured to apply self-oscillating pulse modulation to an audio signal. The modulation circuit is configured to receive, from a signal generation circuit, a supply of a synchronizing signal with which the self-oscillation synchronizes. The band elimination filter is configured to reduce components that belong to a frequency band including a frequency of the synchronizing signal, in an output signal from the self-excited class D amplifier circuit.

3 Claims, 5 Drawing Sheets

(56) References Cited

U.S. PATENT DOCUMENTS

2011/0110539 A1* 5/2011 Chen .................. H03F 3/45475
 381/120
2016/0352293 A1* 12/2016 Bostrom ............. H03F 3/45475

FOREIGN PATENT DOCUMENTS

| JP | 2009-111693 A | 5/2009 |
|----|---------------|--------|
| JP | 2012-49893 A  | 3/2012 |

OTHER PUBLICATIONS

Japanese-language Written Opinion (PCT/ISA/237) issued in PCT Application No. PCT/JP2017/024342 dated Sep. 19, 2017 (three (3) pages).

Japanese-language Office Action issued in Japanese Application No. 2019-528196 dated Aug. 4, 2020 with English translation (five (5) pages).

Japanese-language Office Action issued in Japanese Application No. 2019-528196 dated Feb. 16, 2021 with English translation (seven (7) pages).

* cited by examiner

AMPLIFYING DEVICE

CROSS REFERENCE TO RELATED APPLICATION

This Application is a Continuation Application of PCT Application No. PCT/JP2017/024342, filed Jul. 3, 2017, the entire contents of which are incorporated herein by reference.

BACKGROUND

Field of the Invention

The embodiments of the present invention relate to technology for amplifying audio signals.

Description of Related Art

A self-excited class D amplifier circuit includes a modulation circuit that performs self-oscillating pulse modulation for an audio signal. If there is an oscillation source that operates at a frequency close to the self-oscillation frequency, beat noise (beat tone) resulting from a difference between the self-oscillation frequency and an operating frequency of the oscillation source may be generated in an output signal. For example, in an audio system in which a plurality of self-excited class D amplifier circuits are juxtaposed, there is a problem in that there occurs beat noise resulting from a difference in the oscillation frequencies among the class D amplifier circuits.

Under the circumstances described above, there is a configuration of a device that supplies a synchronizing signal at a predetermined frequency to each of modulation circuits of class D amplifier circuits. Each of the self-oscillations of the modulation circuits is synchronized with the synchronizing signal. At this time, since the class D amplifier circuits oscillate at the same frequency, beat noise resulting from the difference of the oscillation frequencies is not generated.

The self-oscillation frequency depends on the amount of delay in a negative feedback channel of an amplified signal. In a condition in which an impedance of a load connected to a class D amplifier circuit is variable, the amount of delay in the negative feedback channel fluctuates in accordance with the impedance of the load. Therefore, there is a problem in that the self-oscillation frequency fluctuates in accordance with the impedance of the load. As the difference between an autonomous self-oscillation frequency and a frequency of a synchronizing signal increases, a synchronizing signal having a higher signal level is required in order to forcibly synchronize the self-oscillation with the synchronizing signal. However, when a synchronizing signal having a high signal level is supplied to a modulation circuit, distortion is generated in a waveform of an audio signal, and as a result, sound quality may be degraded (for example, an S/N ratio may decrease or total harmonic distortion may increase).

SUMMARY

In view of the circumstances described above, an object of an aspect according to the present invention is to suppress a difference between a self-oscillation frequency and a frequency of a synchronizing signal.

In order to solve the above problem, an inventive amplifying device includes a self-excited class D amplifier circuit including a modulation circuit that is configured to apply self-oscillating pulse modulation to an audio signal; and a band elimination filter, in which, the modulation circuit is configured to receive, from a signal generation circuit, a supply of a synchronizing signal with which the self-oscillation synchronizes; and in which, the band elimination filter is configured to reduce components that belong to a frequency band including a frequency of the synchronizing signal, in an output signal from the self-excited class D amplifier circuit.

DESCRIPTION OF THE EMBODIMENTS

Figure 1:
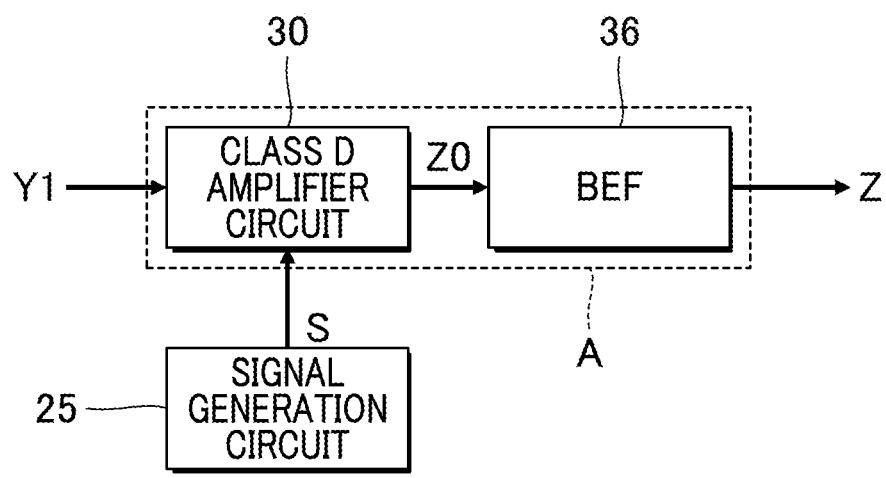
FIG. 1 is a block diagram showing a configuration of an inventive amplifying device.

FIG. 1 is a block diagram showing a configuration of an inventive amplifying device A. The amplifying device generates an audio signal Z by amplifying an analog audio signal Y1 representative of various sounds such as voice sounds or musical sounds. As shown in FIG. 1, the amplifying device A includes a class D amplifier circuit 30 and a band elimination filter (BEF) 36. The class D amplifier circuit 30 generates an audio signal Z0 by amplifying the audio signal Y1. The band elimination filter 36 outputs the audio signal Z in which signal components in a specific frequency band of the audio signal Z0 amplified by the class D amplifier circuit 30 have been reduced. The class D amplifier circuit 30 receives a synchronizing signal S from a signal generation circuit 25.

Figure 2:
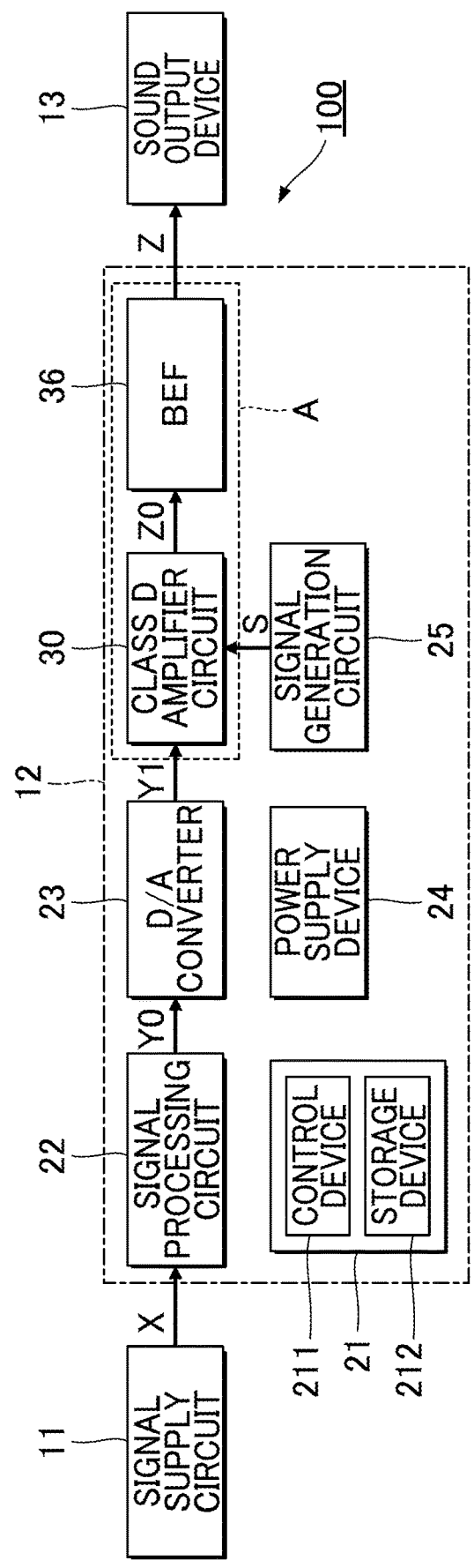
FIG. 2 is a block diagram showing a configuration of an inventive audio system.

FIG. 2 is a block diagram showing a configuration of an audio system 100 using the amplifying device A shown in FIG. 1. As shown in FIG. 2, the audio system 100 is one that reproduces various sounds such as musical sounds or voice sounds. The audio system 100 includes a signal supply device 11, an audio processing device 12, and a sound output device 13. It is to be noted that any two or more elements of the audio system 100 may be integrally formed. For example, the signal supply device 11 may be mounted on the audio processing device 12.

The signal supply device 11 is a signal source that supplies a digital or analog audio signal X representative of various sounds such as voice sounds or musical sounds to the audio processing device 12. For example, a reproduction device that reads out the audio signal X from a portable or built-in recording medium is an example of the signal supply device 11. Furthermore, there may be used, as the signal supply device 11, a sound collecting device that collects peripheral sounds to generate an audio signal X, or a communication device that receives the audio signal X from another device via a communication network.

The audio processing device 12 generates an audio signal Z by processing the audio signal X supplied from the signal supply device 11. The sound output device 13 is, for example, a speaker or a headphone and plays sounds representative of the audio signal Z generated by the audio processing device 12.

As shown in FIG. 2, the audio processing device 12 includes a control unit 21, a signal processing circuit 22, a D/A converter 23, a power supply device 24, and the signal generation circuit 25 and the amplifying device A described above. The audio signal X output from the signal supply device 11 is supplied to the signal processing circuit 22. In a case in which the audio signal X is analog, there may be provided an A/D converter (not shown) that converts the audio signal X from analog to digital. In this case, the signal processing circuit 22 receives a supply of the audio signal X converted by an A/D converter.

The control unit 21 is a controller that controls each element of the audio processing device 12. The control unit 21 includes a control device 211 and a storage device 212. The control device 211 is, for example, an arithmetic processing circuit such as a CPU (Central Processing Unit). The control device 211 controls each element of the audio processing device 12 by executing programs stored in the storage device 212. The storage device 212 stores therein programs to be executed by the control device 211 and various pieces of data to be used by the control device 211. Examples of the storage device 212 includes a known recording medium such as a semiconductor recording medium, a magnetic recording medium, and a combination of multiple types of recording media.

The signal processing circuit 22 is configured by, for example, a DSP (Digital Signal Processor) for audio processing. The signal processing circuit 22 applies signal processing to the audio signal X supplied from the signal supply device 11 to generate an audio signal Y0. Examples of signal processing by the signal processing circuit 22 includes crossover processing for dividing the audio signal X into a plurality of bands, delay processing for delaying the audio signal X, equalizer processing for adjusting frequency characteristics of the audio signal X, limiter processing for limiting a voltage range of the audio signal X, and howling suppression processing for suppressing howling. Alternatively, some or all of the functions of the signal processing circuit 22 may be realized by the control device 211.

The D/A converter 23 in FIG. 2 converts the digital audio signal Y0 generated by the signal processing circuit 22 to an analog audio signal Y1. As described with reference to FIG. 1, the amplifying device A includes the self-excited class D amplifier circuit 30 and the band elimination filter 36. The class D amplifier circuit 30 amplifies the audio signal Y1 supplied from the D/A converter 23 to generate an audio signal Z0. The band elimination filter 36 reduces signal components in a specific frequency band of the audio signal Z0 amplified by the class D amplifier circuit 30. Specific characteristics of the band elimination filter 36 will be described later. The audio signal Z output from the band elimination filter 36 is supplied to the sound output device 13 (load). The power supply device 24 generates a power-supply voltage and supplies the power-supply voltage to each element of the audio system 100. The power supply device 24 is a switching power supply that carry outs a switching operation at a predetermined frequency, to generates a DC power-supply voltage.

The signal generation circuit 25 is an oscillation circuit that generates a synchronizing signal S. The synchronizing signal S is a clock signal that fluctuates at a predetermined frequency Fs. The frequency Fs is set to a predetermined value (for example, 200 kHz) beyond the audible range (band). When beat noise occurs resulting from a frequency difference between a frequency Fp of the switching operation (hereinafter, "switching frequency") of the power supply device 24 and a self-oscillating oscillation frequency Fo of the class D amplifier circuit 30, it is desired to match the frequency Fs of the synchronizing signal S with the switching frequency Fp. However, the frequency Fs of the synchronizing signal S need not match the switching frequency Fp, if the beat noise resulting from the frequency difference between the self-oscillating oscillation frequency Fo and the switching frequency Fp is not a particular problem (for example, a frequency at which the frequency difference becomes beyond the audible range). Alternatively, the signal generation circuit 25 may be realized by the signal processing circuit 22.

Figure 3:
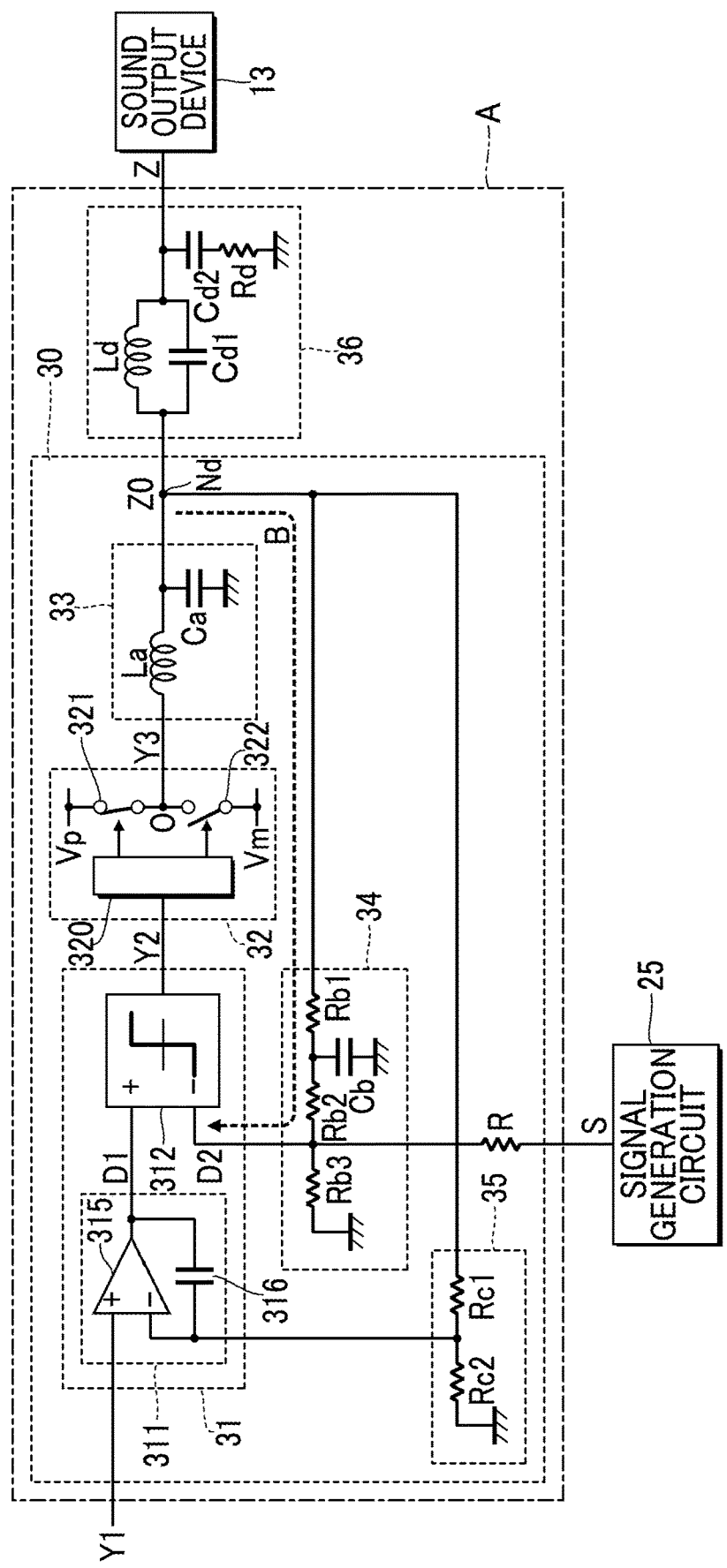
FIG. 3 is a circuit diagram of an inventive amplifying device.

FIG. 3 is a circuit diagram of the class D amplifier circuit 30 and the band elimination filter 36. As shown in FIG. 3, the class D amplifier circuit 30 includes a modulation circuit 31, a switch circuit 32, a low-pass filter 33, a first feedback circuit 34, and a second feedback circuit 35. The modulation circuit 31 generates a modulation signal Y2 by applying self-oscillating pulse modulation (pulse width modulation or pulse density modulation) to the audio signal Y1. The modulation signal Y2 is a binary signal that fluctuates at a duty ratio corresponding to the signal level of the audio signal Y1.

The switch circuit 32 generates an amplified signal Y3 by amplifying the modulation signal Y2 generated by the modulation circuit 31. This amplification is achieved by a switching operation. The switch circuit 32 includes a drive circuit 320, a first switch 321, and a second switch 322. Each of the first switch 321 and the second switch 322 is configured by a switching element, for example, a MOSFET (Metal Oxide Semiconductor Field Effect Transistor). The first switch 321 is present between a positive-side power supply (a power-supply voltage Vp) and an output point O. The second switch 322 is present between a negative-side power supply (a power-supply voltage Vm) and the output point O. The drive circuit 320 controls any of the first switch 321 and the second switch 322 to be in an ON state in accordance with the modulation signal Y2 generated by the modulation circuit 31. Specifically, if the modulation signal Y2 is at a high level, the drive circuit 320 controls the first switch 321 to be in an ON state, and if the modulation signal Y2 is at a low level, the drive circuit 320 controls the second switch 322 to be in an ON state. When the first switch 321 is controlled to be in an ON state, the power-supply voltage Vp is applied to the output point O, and when the second switch 322 is controlled to be in an ON state, the power-supply voltage Vm is applied to the output point O. In other words, an amplified signal Y3 generated at the output point O is a square wave that fluctuates from one to the other between the power-supply voltage Vp and the power-supply voltage Vm at a duty ratio substantially the same as the modulation signal Y2.

The low-pass filter (LPF) 33 outputs an audio signal Z0 by reducing high-frequency components (for example, band components including an oscillation frequency of the modulation circuit 31) of the amplified signal Y3 output by the switch circuit 32. In other words, low-frequency components including the audible band of the amplified signal Y3 are extracted as an audio signal Z0. As shown in FIG. 3, the low-pass filter 33 includes, for example, a capacitor Ca and an inductor La.

The audio signal Z0 output by the low-pass filter 33 is fed back to the modulation circuit 31. Specifically, there are two feedback channels. One is a feedback channel (hereinafter, referred to "feedback channel B") from an output node Nd of the class D amplifier circuit 30 (the former stage of the band elimination filter 36) to the modulation circuit 31 via the first feedback circuit 34. The other one is a feedback channel from the output node Nd of the class D amplifier circuit 30 to the modulation circuit 31 via the second feedback circuit 35. The first feedback circuit 34 is a delay circuit for delaying the audio signal Z0 and is configured by, for example, resistor elements Rb (Rb1, Rb2, and Rb3) and a capacitor Cb. The second feedback circuit 35 is a voltage-dividing circuit including resistor elements Rc (Rc1 and Rc2).

As shown in FIG. 3, the inventive modulation circuit 31 includes an integration circuit 311 and a comparison circuit 312. The integration circuit 311 includes an operational amplifier 315 and a capacitor 316. The audio signal Y1 output by the D/A converter 23 is supplied to a positive input terminal of the operational amplifier 315. The voltage representative of the audio signal Z0 is divided by the resistor element Rc1 and the resistor element Rc2 of the second feedback circuit 35. Then the divided voltage is supplied to a negative input terminal of the operational amplifier 315. The second feedback circuit 35 functions as negative feedback for proportionating the voltage representative of the audio signal Z0 supplied to the sound output device 13 to a voltage of the audio signal Y1. The overall gain and frequency response of the class D amplifier circuit 30 are determined by the second feedback circuit 35.

As shown in FIG. 3, an output signal D1 of the integration circuit 311 is supplied to a positive input terminal of the comparison circuit 312. Furthermore, a feedback signal D2 obtained by delaying the audio signal Z0 by the first feedback circuit 34 is supplied to a negative input terminal of the comparison circuit 312. The comparison circuit 312 compares the output signal D1 from the integration circuit 311 with the feedback signal D2 to generate a modulation signal Y2 in accordance with a comparison result. In other words, the comparison circuit 312 sets the modulation signal Y2 to a high level in a period in which the voltage representative of the output signal D1 exceeds the voltage representative of the feedback signal D2. In contrast, the comparison circuit 312 sets the modulation signal Y2 to a low level in a period in which the voltage representative of the output signal D1 falls below the voltage representative of the feedback signal D2. As is understood from the above descriptions, the first feedback circuit 34 functions as negative feedback for the comparison circuit 312 to perform self-oscillating pulse modulation. The synchronizing signal S generated by the signal generation circuit 25 is used to adjust the self-oscillating oscillation frequency Fo to the frequency Fs of the synchronizing signal S, under low-volume circumstances in which beat noise becomes a problem.

As shown in FIG. 3, the synchronizing signal S generated by the signal generation circuit 25 is supplied to the modulation circuit 31 via the resistor element R. Specifically, the synchronizing signal S is supplied to the negative input terminal of the comparison circuit 312 together with the feedback signal D2 output from the first feedback circuit 34. The comparison circuit 312 generates the modulation signal Y2 by self-oscillation synchronized with the synchronizing signal S. That is, the self-oscillating oscillation frequency Fo is forcibly adjusted to the frequency Fs of the synchronizing signal S. In other words, pulse modulation by the modulation circuit 31 is synchronized with the synchronizing signal S. As is understood from the above descriptions, the synchronizing signal S is a signal with which the self-oscillation of the modulation circuit 31 is synchronized. The synchronizing signal S is set to a relatively high signal level, as compared with the level of the audio signal Z0 via the first feedback circuit 34. Specifically, the synchronizing signal S is set to a signal level at which the influence of the synchronizing signal S with respect to the operation of the comparison circuit 312 becomes dominant, in a state in which the signal level of the audio signal X is low to an extent that the beat noise becomes a problem. At this time, the influence of the audio signal Z0 supplied via the first feedback circuit 34 can be substantially ignored. The self-excited class D amplifier circuit 30 is configured as a class D amplifier circuit that autonomously self-oscillates in a state in which there is no supply of a synchronizing signal from an external circuit or in a state in which the influence of the synchronizing signal S is not dominant.

It is assumed that the self-oscillation of the comparison circuit 312 is not forcibly synchronized with the synchronizing signal S. In this case, for example, when the switching frequency Fp of the power supply device 24 and the oscillation frequency Fo are close to each other, a frequency difference between these becomes a problem. Specifically, beat noise (beat tone) resulting from the difference between the switching frequency Fp and the oscillation frequency Fo may be generated in an output signal. The above problem may similarly occur in a case in which an oscillation source that operates at a frequency close to the self-oscillating oscillation frequency Fo is arranged close to the class D amplifier circuit 30. The power supply device 24 is one example of the oscillation source described above. In a state in which the signal level of an audio signal X is low to an extent that beat noise becomes a problem, self-oscillation of the modulation circuit 31 is synchronized with the synchronizing signal S due to supply of the synchronizing signal S. That is, the oscillation frequency Fo is adjusted to the frequency Fs of the synchronizing signal S. Therefore, it is possible to suppress (and ideally, not to generate) beat noise resulting from the frequency difference between the oscillation frequency Fo and the switching frequency Fp (=Fs) of the power supply device 24.

As shown in FIG. 3, the band elimination filter 36 is connected to the latter stage of the low-pass filter 33. That is, the band elimination filter 36 is present between the low-pass filter 33 and the sound output device 13. Each of the first feedback circuit 34 and the second feedback circuit 35 is connected to the output node Nd, which is positioned between the low-pass filter 33 and the band elimination filter 36. That is, there is a negative feedback channel from the output node Nd of the class D amplifier circuit 30 to the modulation circuit 31. The configuration of the band elimination filter 36 is freely selectable. In an example of FIG. 3, the band elimination filter 36 is a parallel resonant notch filter including: a capacitor Cd1 and an inductor Ld connected to each other in parallel; and a capacitor Cd2 and a resistor element Rd connected to the latter stage of the capacitor Cd1 and the inductor Ld. However, the configuration of the band elimination filter 36 is not limited to the one shown in FIG. 3. As shown in FIG. 3, the amplifying device A is configured by the class D amplifier circuit 30 and the band elimination filter 36.

Figure 4:
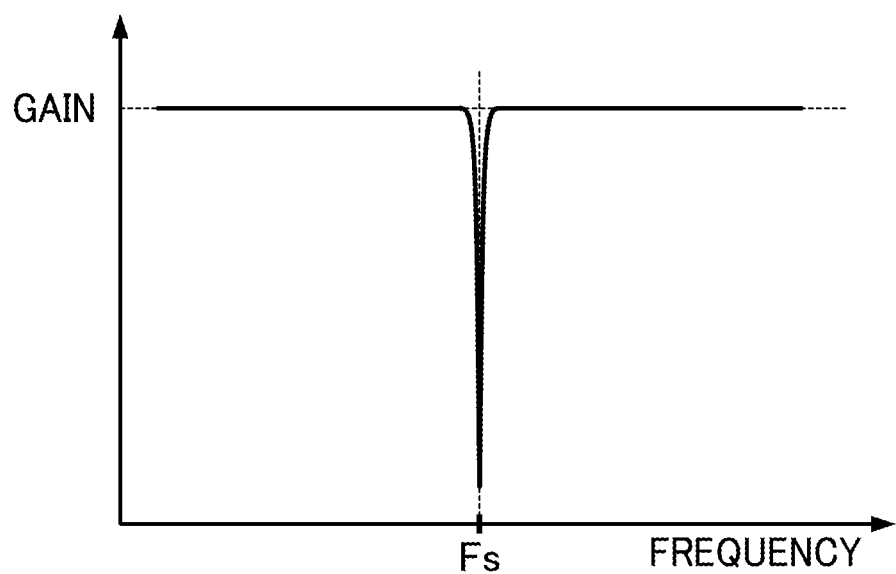
FIG. 4 is a graph showing a frequency response of a band elimination filter.

As shown in FIG. 4, the band elimination filter 36 reduces signal components in a very narrow frequency band, of the audio signal Z0 output from the low-pass filter 33. As shown in FIG. 4, the frequency band reduced by the band elimination filter 36 is a frequency band including the frequency Fs of the synchronizing signal S generated by the signal generation circuit 25.

As described above, the band elimination filter 36 reduces components of the frequency Fs of the synchronizing signal S, of the audio signal Z0 output from the class D amplifier circuit 30. The audio signal Z that has been processed by the band elimination filter 36 is supplied to the sound output device 13. In the foregoing configuration, with regard to the oscillation frequency Fo (=Fs) defined by the synchronizing signal S, an impedance of the sound output device 13 as viewed from an output of the class D amplifier circuit 30 reaches maximum (and is ideally infinite). Therefore, with regard to an elimination band of the band elimination filter 36, a delay amount in the negative feedback channel B is hardly affected by the impedance of the sound output device 13 (the load). Accordingly, the autonomous oscillation frequency Fo in a state in which dominance of the synchronizing signal S is weak (that is, the signal level of the audio signal X is high) is designed to a frequency substantially equal to the frequency Fs of the synchronizing signal S (within the elimination band of the band elimination filter 36). In this case, the oscillation frequency Fo does not fluctuate greatly from the frequency Fs of the synchronizing signal S due to the fluctuation of the impedance of the load. In other words, there is an advantage in that the oscillation frequency Fo hardly fluctuates even if the impedance of the sound output device 13 fluctuates (for example, even if the sound output device 13 is replaced).

It is assumed that the frequency difference between the oscillation frequency Fo and the frequency Fs of the synchronizing signal S is large. In this case, it is difficult to perform forced synchronization (entrainment) of self-oscillation by the synchronizing signal S. Therefore, to synchronize the self-oscillation of the modulation circuit 31 with the synchronizing signal S, the level of the synchronizing signal S needs to be set to a sufficiently high level as compared with a configuration in which the frequency difference is small. According to the configuration of the amplifying device in which the oscillation frequency Fo hardly fluctuates, an increase in the frequency difference between the oscillation frequency Fo and the frequency Fs of the synchronizing signal S can be suppressed. Therefore, the self-oscillation of the modulation circuit 31 can be appropriately synchronized even with the synchronizing signal S having a small signal level. There is an advantage in that deterioration of the sound quality resulting from the synchronizing signal S (for example, a decrease of the S/N ratio or an increase of total harmonic distortion) can be reduced by suppressing the level of the synchronizing signal S. As is understood from the foregoing descriptions, deterioration of sound quality can be reduced by suppressing the level of the synchronizing signal S, while suppressing beat noise by stabilizing the oscillation frequency Fo.

Figure 5:
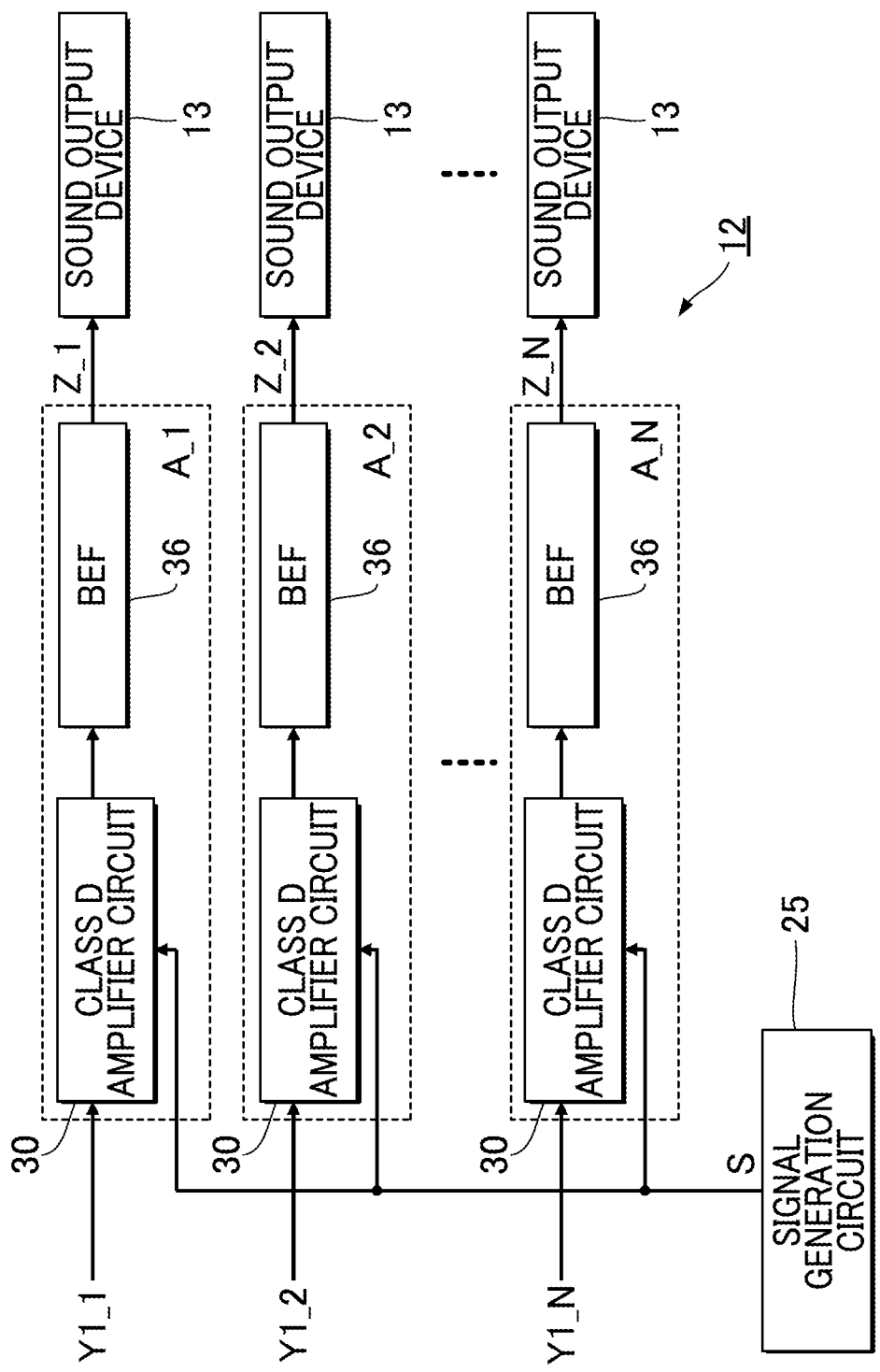
FIG. 5 is a block diagram showing a configuration of an audio system.

FIG. 5 is a block diagram showing a configuration of the audio processing device 12. The audio processing device 12 is a multi-channel audio system including N channels. As shown in FIG. 5, the audio processing device 12 includes N amplifying devices A_1 to A_N, each of which corresponds to any one of the channels different from each other (N is a natural number equal to or greater than 2). Any one of the amplifying devices A_n (n=1 to N) receives a supply of an audio signal Y1_$n$ of an nth channel that has been processed by the signal processing circuit 22 and the D/A converter 23.

Each amplifying device A_n includes the class D amplifier circuit 30 and the band elimination filter 36 as in the amplifying device A. The sound output device 13 is connected to the band elimination filter 36 of each of the amplifying devices A_n. The amplifying device A_n generates an audio signal Z_n by amplifying the audio signal Y1_$n$ and supplies the audio signal Z_n to the sound output device 13. As shown in FIG. 5, a synchronizing signal S generated by the signal generation circuit 25 is commonly supplied to each of the class D amplifier circuits 30 of the N amplifying devices A_1 to A_N.

As shown in FIG. 5, in the configuration of the amplifying device including the N amplifying devices A_1 to A_N, there is a problem in that beat noise occurs resulting from a difference of the oscillation frequency Fo between each of the amplifying devices A_n (that is, between the channels). Since an individual difference of the oscillation frequency Fo is reduced (ideally, eliminated) due to the supply of the synchronizing signal S, beat noise resulting from the difference of the oscillation frequency Fo between the channels can be suppressed.

The embodiments detailed above may be modified in various ways. An Example of specific modification will now be described. Two or more modes selected freely from among the following modifications may be appropriately combined.

(1) In the foregoing embodiments, a synchronizing signal S is supplied to the negative input terminal of the comparison circuit 312 in the modulation circuit 31. However, the position to which the synchronizing signal S is supplied in the modulation circuit 31 is not limited to the example described above. For example, the synchronizing signal S may be supplied to the positive input terminal of the comparison circuit 312 together with an output signal D1 of the integration circuit 311.

(2) The following configurations, for example, are derivable from the foregoing embodiments.

The inventive amplifying device includes a self-excited class D amplifier circuit including a modulation circuit that is configured to apply self-oscillating pulse modulation to an audio signal; and a band elimination filter, wherein the modulation circuit is configured to receive, from a signal generation circuit, a supply of a synchronizing signal with which the self-oscillation synchronizes; and wherein the band elimination filter is configured to reduce components that belong to a frequency band including a frequency of the synchronizing signal, in an output signal from the self-excited class D amplifier circuit.

In the aspect described above, self-oscillation of the modulation circuit is synchronized with the synchronizing signal due to supply of the synchronizing signal to the modulation circuit. That is, an oscillation frequency is adjusted to the frequency of the synchronizing signal. Therefore, there can be suppressed beat noise resulting from a difference between the oscillation frequency and an operating frequency of an oscillation source that operates at a frequency close to the oscillation frequency. Furthermore, the band elimination filter reduces the components in the frequency band including the frequency of the synchronizing signal, of the output signal from the class D amplifier circuit. In other words, with regard to the oscillation frequency defined by the synchronizing signal, the impedance of a load as viewed from the class D amplifier circuit reaches maximum (and is ideally infinite). Therefore, there is an advantage in that, even if the impedance of the load fluctuates, the oscillation frequency hardly fluctuates.

The self-excited class D amplifier circuit may include a feedback circuit configured to feed back the output signal from an output node of the self-excited class D amplifier.

DESCRIPTION OF REFERENCE SIGNS

100 . . . audio system, 11 . . . signal supply device, 12 . . . audio processing device, 13 . . . sound output device, 21 . . . control unit, 211 . . . control device, 212 . . . storage device, 22 . . . signal processing circuit, 23 . . . D/A converter, 24 . . . power supply device, 25 . . . signal generation circuit, 30 . . . class D amplifier circuit, 31 . . .

modulation circuit, 311 . . . integration circuit, 312 . . . comparison circuit, 32 . . . switch circuit, 320 . . . drive circuit, 321 . . . first switch, 322 . . . second switch, 33 . . . low-pass filter, 34 . . . first feedback circuit, 35 . . . second feedback circuit, 36 . . . band elimination filter, A . . . amplifying device, Nd . . . output node.

What is claimed is:

1. An amplifying device comprising:
a self-excited class D amplifier circuit including a modulation circuit that is configured to apply self-oscillating pulse modulation to an audio signal; and
a band elimination filter, wherein
the modulation circuit is configured to receive, from a signal generation circuit, a supply of a synchronizing signal with which the self-oscillation synchronizes; and
the band elimination filter is configured to reduce components that belong to a frequency band including a frequency of the synchronizing signal, in an output signal from the self-excited class D amplifier circuit, wherein the self-excited class D amplifier circuit further comprises:
a low-pass filter configured to reduce high-frequency components of an output signal from the modulation circuit;
an output node that is disposed between the low-pass filter and the band elimination filter; and
a feedback circuit configured to feedback a signal on the output node to the modulation circuit.

2. The amplifying device according to claim 1, wherein:
the modulation circuit includes:
an integration circuit configured to integrate a first audio signal representative of the audio signal; and
a comparison circuit configured to include:
a first input configured to receive the integrated first audio signal made by the integration circuit; and
a second input configured to receive the feedback signal from the feedback circuit, the comparison circuit is configured to compare the integrated first audio signal with the feedback signal, to generate a second audio signal, and the synchronizing signal is supplied to the second input of the comparison circuit with the feedback signal.

3. An audio processing device comprising:
an amplifying device; and
a switching power supply device, wherein:
the switching power supply device is configured to generate, by carrying out a switching operation, a power-supply voltage for the audio processing device,
the amplifying device includes:
a self-excited class D amplifier circuit including a modulation circuit that is configured to apply self-oscillating pulse modulation to an audio signal; and
a band elimination filter, the modulation circuit is configured to receive, from a signal generation circuit, a supply of a synchronizing signal with which the self-oscillation synchronizes; and
the band elimination filter is configured to reduce components that belong to a frequency band including a frequency of the synchronizing signal, in an output signal from the self-excited class D amplifier circuit, and
a frequency of the switching operation carried out by the switching power supply device matches a frequency of synchronizing signal.

\* \* \* \* \*